(12) United States Patent
Chen et al.

(10) Patent No.: US 7,776,494 B2
(45) Date of Patent: Aug. 17, 2010

(54) LITHOGRAPHIC MASK AND METHODS FOR FABRICATING A SEMICONDUCTOR DEVICE

(75) Inventors: Norman Shaowen Chen, Poughkeepsie, NY (US); Chidam Kallingal, Poughkeepsie, NY (US)

(73) Assignee: Global Foundries Inc., Grand Cayman (KY)

( * ) Notice: Subject to any disclaimer, the term of this patent is extended or adjusted under 35 U.S.C. 154(b) by 413 days.

(21) Appl. No.: 11/616,860

(22) Filed: Dec. 28, 2006

(65) Prior Publication Data

US 2008/0160422 A1   Jul. 3, 2008

(51) Int. Cl.
    G03F 1/00         (2006.01)
(52) U.S. Cl. .......................... 430/5; 430/311
(58) Field of Classification Search ............ 430/5, 430/311–313, 322–324
    See application file for complete search history.

(56) References Cited

U.S. PATENT DOCUMENTS

| | | | | |
|---|---|---|---|---|
| 5,306,585 A | * | 4/1994 | Okamoto | 430/5 |
| 5,679,499 A | * | 10/1997 | Yamamori | 430/313 |
| 5,955,222 A | * | 9/1999 | Hibbs et al. | 430/5 |
| 6,013,397 A | * | 1/2000 | Lin et al. | 430/5 |
| 6,451,488 B1 | * | 9/2002 | Rhodes | 430/5 |
| 6,582,856 B1 | * | 6/2003 | Quek et al. | 430/5 |
| 6,841,310 B2 | * | 1/2005 | Dulman | 430/5 |
| 2001/0021476 A1 | * | 9/2001 | Gans et al. | 430/5 |
| 2003/0203291 A1 | * | 10/2003 | Misaka | 430/5 |
| 2005/0084771 A1 | * | 4/2005 | Nolscher | 430/5 |

* cited by examiner

*Primary Examiner*—Mark F Huff
*Assistant Examiner*—Stewart A Fraser
(74) *Attorney, Agent, or Firm*—Ingrassia Fisher & Lorenz, P.C.

(57) ABSTRACT

Methods for fabricating a semiconductor device and a lithographic mask of use in that method are provided for. The lithographic mask comprises an optically transparent substrate, an attPSM pattern overlying the optically transparent substrate, and a phase shifted optically transparent portion adjacent to and aligned with an edge of the attPSM pattern.

20 Claims, 6 Drawing Sheets

LITHOGRAPHIC MASK AND METHODS FOR FABRICATING A SEMICONDUCTOR DEVICE

TECHNICAL FIELD

The present invention generally relates to a lithographic mask and to methods for fabricating a semiconductor device, and more particularly relates to a phase shift lithographic mask and to methods for fabricating semiconductor devices using such a mask.

BACKGROUND

Semiconductor devices such as integrated circuits are generally fabricated by the repeated application of a photolithographic process. A photosensitive material is applied to the surface of a semiconductor substrate, which may include layers of dielectric materials, polycrystalline silicon, and various metals, and a radiation source is used to transfer the pattern of a lithographic mask or reticle onto the photosensitive material. The patterned photosensitive material is then used as a process mask to process the semiconductor substrate or one of the layers on the substrate. The process mask may be used, for example, an etch mask or as an ion implantation mask. As the number of individual devices incorporated in the design of a semiconductor integrated circuit increases, there is a growing need to decrease the minimum feature size, that is, the minimum line width or minimum space between lines of individual elements of the devices. As the minimum feature size decreases, especially when the minimum feature size is less than the wavelength of the radiation source it becomes increasingly difficult to adequately resolve the features because of diffraction and interference effects. Optical distortion causes a loss of the anticipated one-to-one correspondence between the image on the mask and the image created in the patterned photosensitive material.

Accordingly, it is desirable to provide a lithographic mask which reduces the problems attendant with processing small geometry semiconductor devices and improves lithographic printing resolution and process window. In addition, it is desirable to provide methods for fabricating small geometry semiconductor devices using such a lithographic mask. Furthermore, other desirable features and characteristics of the present invention will become apparent from the subsequent detailed description and the appended claims, taken in conjunction with the accompanying drawings and the foregoing technical field and background.

BRIEF SUMMARY

A lithographic mask is provided for use in fabricating, for example, a semiconductor device. The lithographic mask comprises an optically transparent substrate, an attPSM pattern overlying the optically transparent substrate, and a phase shifted optically transparent portion adjacent to and aligned with an edge of the attPSM pattern.

Methods are provided for fabricating a semiconductor device. In accordance with one embodiment the method comprises providing a semiconductor substrate, depositing a material layer overlying the semiconductor substrate, and applying a layer of photosensitive material overlying the material layer. A lithographic mask comprising an optically transparent portion, an attPSM pattern, and a phase shifted optically transparent portion adjacent the attPSM pattern is positioned over the layer of photosensitive material. The layer of photosensitive material is exposed to radiation passing through the mask to form selectively exposed portions of the layer of photosensitive material, and the layer of photosensitive material is developed to form a patterned layer overlying the material layer. The material layer is processed using the patterned layer as a process mask.

BRIEF DESCRIPTION OF THE DRAWINGS

The present invention will hereinafter be described in conjunction with the following drawing figures, wherein like numerals denote like elements, and wherein.

DETAILED DESCRIPTION

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

Figure 1:
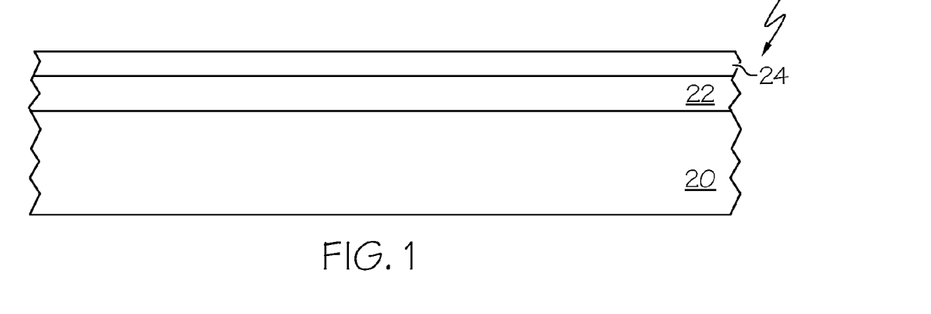
FIGS. 1-5 illustrate, in cross section, method steps in the fabrication of a semiconductor device in accordance with an embodiment of the invention.

FIGS. 1-5 illustrate, in cross section, method steps in accordance with an embodiment of the invention for fabricating a semiconductor device 18. Many of the steps employed in the fabrication of semiconductor devices are well known and so, in the interest of brevity, some of those conventional steps will only be mentioned briefly herein or will be omitted entirely without providing the well known process details. As illustrated in FIG. 1, the method starts with a semiconductor substrate 20. The substrate can be a bulk semiconductor wafer or a semiconductor on insulator (SOI) substrate (not illustrated). The substrate can be, for example, a silicon wafer, and will be referred to hereinafter for convenience, but without limitation, alternatively as a semiconductor substrate or as a silicon substrate. The substrate may also include dielectric layers, metal layers, impurity doped regions in the substrate, and the like, as are well known to those of skill in the semiconductor art. A material layer 22 that is to be processed is deposited or otherwise formed on the surface of the substrate. Material layer 22 can be, for example, a layer of gate electrode forming material such as polycrystalline silicon that is to be patterned to form gate electrodes of a plurality of field effect transistors. Material layer 22 will hereinafter be referred to, for ease of reference but without limitation, as a layer of polycrystalline silicon for the formation of gate electrodes, although those of skill in the art will understand that material layer 22 can be a material other than polycrystalline silicon and can be used for purposes other than the formation of gate electrodes. Gate electrode polycrystalline silicon is selected for purposes of illustration because the gate electrode is often the device element having the smallest and most critical of all photolithography defined dimensions. Polycrystalline silicon can be deposited as either an impurity doped or undoped layer by the reduction of silane in a low pressure chemical vapor deposition (LPCVD) reaction. The polycrystalline silicon layer must be photolithographically patterned and etched to form the desired pattern of gate electrodes and gate electrode interconnects. To accomplish this, a layer of photosensitive material 24, such as a layer of photoresist, is applied to the surface of the polycrystalline silicon. As is well known to those of skill in the art, adhesion promoters and/or antireflective coatings (not illustrated) may be applied to the polycrystalline silicon layer before the photosensitive material is applied. Photosensitive material 24 can be selected from the well known and commercially available photoresist materials. The photosensitive material can be either positive or negative type photosensitive material.

Figure 2:
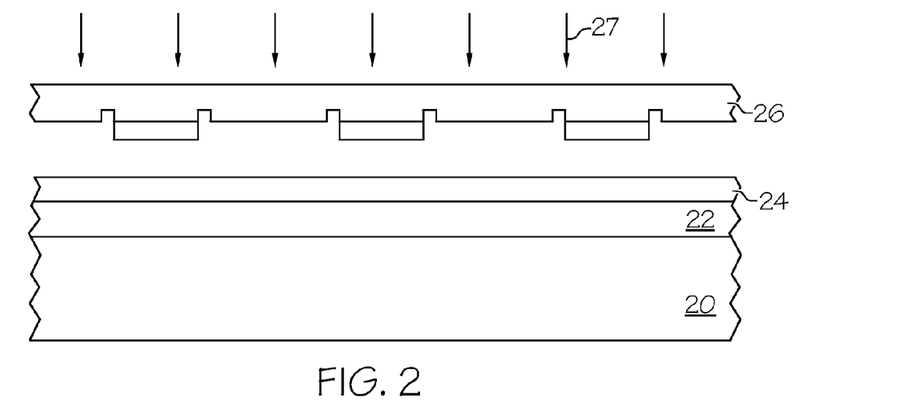

As illustrated in FIG. 2, a photomask 26 is positioned over the layer of photosensitive material and radiation, indicated by the arrows 27, is incident on the photomask, selectively passes through the photomask, and selectively exposes the layer of photosensitive material to transfer the mask pattern to the layer of photosensitive material. The incident radiation can be 248 nanometer (nm) krypton fluoride excimer laser radiation, 193 nm radiation from an argon fluoride source, or other commonly used photolithographic radiation.

Figure 9:
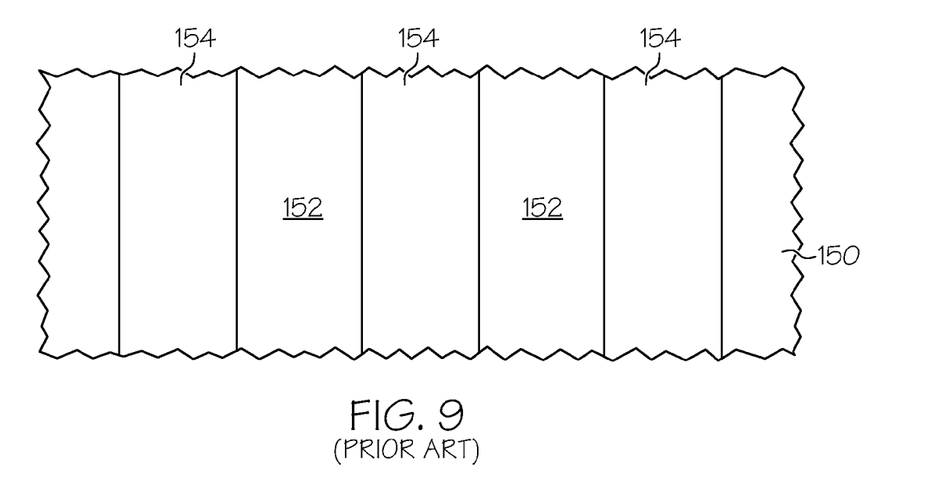
FIG. 9 illustrates, in plan view, a prior art phase shift mask.

FIG. 9 illustrates, in plan view, a portion of a conventional phase shift mask (PSM) 150. The conventional PSM includes a transparent substrate 152 and a plurality of attenuated phase shift mask (attPSM) portions 154 that are intended to be replicated in layer 24 of photosensitive material and ultimately in polycrystalline silicon layer 22 to form gate electrodes of the semiconductor device. As device sizes and the minimum device geometries shrink, it becomes more and more difficult to replicate portions 154 in polycrystalline silicon layer 22 because of optical diffraction and interference effects.

Figure 10:
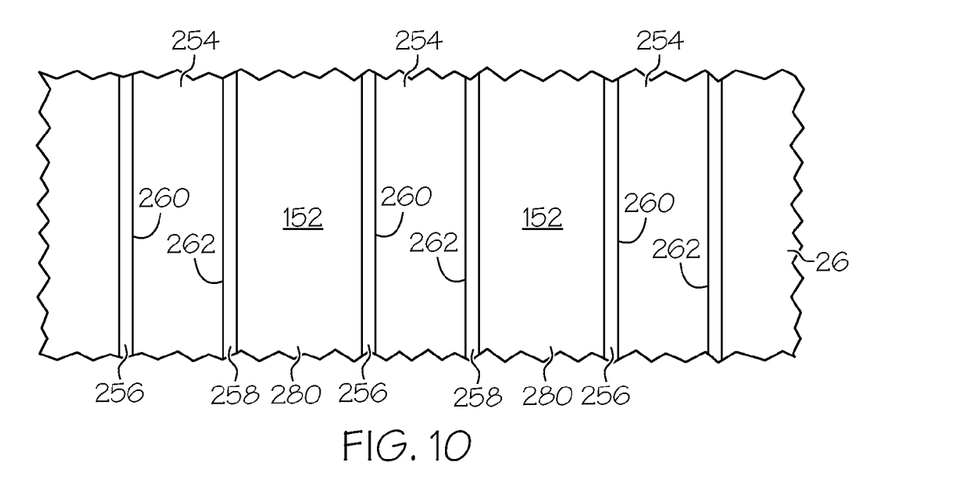
FIGS. 10 and 11 illustrate, in plan view and cross section, respectively, a portion of a phase shift mask in accordance with an embodiment of the invention.
Figure 11:
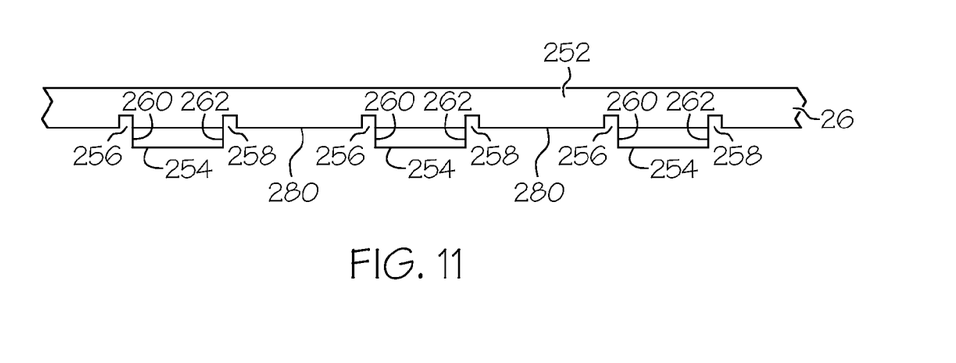

In accordance with one embodiment of the invention, as illustrated in plan view in FIG. 10 and in cross section in FIG. 11, a phase shift mask 26 includes, in addition to transparent substrate 252 and attPSM pattern 254, phase shifted optically transparent portions 256 and 258 adjacent to and aligned with edges 260 and 262, respectively, of attPSM pattern 254. Transparent, non-phase shifted portions 280 of the mask remain between, for example, attPSM patterns 254. Transparent substrate 252 is preferably a quartz substrate although it could be fused silica or other material that is substantially transparent to the incident radiation used to expose the photosensitive material. The attPSM pattern of the mask is formed by a layer of partially transparent, partially absorbing, phase shifting film. The film can be, for example, a film comprising molybdenum and silicon such as a molybdenum silicide film or a layer including molybdenum, silicon, oxygen and nitrogen (oxynitride), or a tantalum containing film. Alternatively, the partially transparent film can be, for example, a half tone dotted chrome film. Such a film will hereinafter be referred to, for convenience but without limitation, as a MoSi film. The partially transparent film typically allows only about 5-10%, in some cases as high as 20%, but preferably about 6% of the incident radiation to be transmitted. As one example the attPSM pattern is in the shape of stripes that are to be replicated in the layer of polycrystalline silicon gate electrode forming material to form parallel gate electrodes. The thickness of the partially transparent film is selected to produce a phase shift of about 180° in the transmitted radiation. Phase shifted optically transparent portions 256 and 258 can be formed, for example, by etching a recess into surface of transparent substrate 252. The recess is etched into the surface of the transparent substrate to a depth of approximately one half wavelength (½ λ) with an appropriate compensation for the ratio of the index of refraction of the optically transparent substrate material and the ambient above the surface of the substrate. Such a recess causes the phase of the incident radiation to be shifted by 180° relative to the radiation transmitted through the remainder of the optically transparent substrate.

Phase shift mask 26 can be fabricated as follows. A layer of MoSi or other phase shift material of the appropriate thickness to provide the desired phase shift is deposited onto the optically transparent substrate. A layer of chrome or other opaque material is deposited overlying the phase shift material. The chrome and the phase shift material are patterned and etched to leave the chrome and phase shift material in mask locations that are to be opaque to the incident radiation. The chrome is then removed from those portions of the mask that are to be the attPSM patterns, generally the fine geometry portions of the mask. The chrome remains on large geometry patterns and will form conventional (non-phase shifted) opaque mask portions. Recesses are then etched into the optically transparent substrate in alignment with the attPSM patterns to form the phase shifted optically transparent portions of the mask. Preferably the recesses have a width of about 5-30 nanometers (nm) and most preferably a width of about 10-20 nm. Precisely controlling the depth of the etched recesses is difficult, but the depth is preferably controlled to cause a phase shift of about 180° plus or minus about 10%. The phase shift will hereinafter be referred to as a 180° phase shift, although those of skill in the art will understand that the shift may not be precisely 180°.

Figure 3:
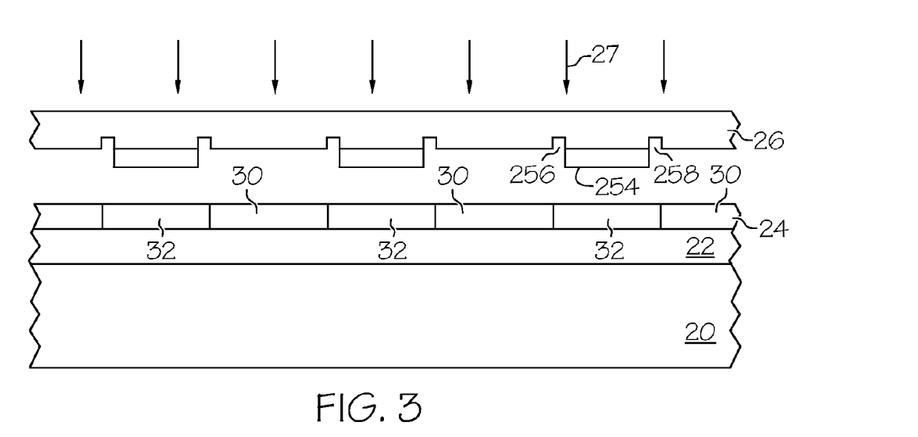

Returning now to the method for fabricating a semiconductor device in accordance with an embodiment of the invention, as illustrated in FIG. 3, photosensitive material 24 is selectively exposed to the transmitted portion of the incident radiation that passes through photomask 26. The transmitted radiation selectively exposes portions 30 of photosensitive material while leaving portions 32 unexposed. The incident radiation passing through the non-shifted transparent portion of the mask selectively exposes the underlying photosensitive material and causes a chemical and/or physical change in exposed portion 30. The phase shift in the 5-10% of the radiation that passes through the partially transparent film 254 and the phase shift in the optically transparent portions 256 and 258 cause destructive interference with some of the radiation passing through the non-shifted transparent portion to effect a sharpening in the exposure at the edge of the pattern in the layer of photosensitive material as defined by the attPSM pattern and by the phase shifted transparent portion.

Figure 4:
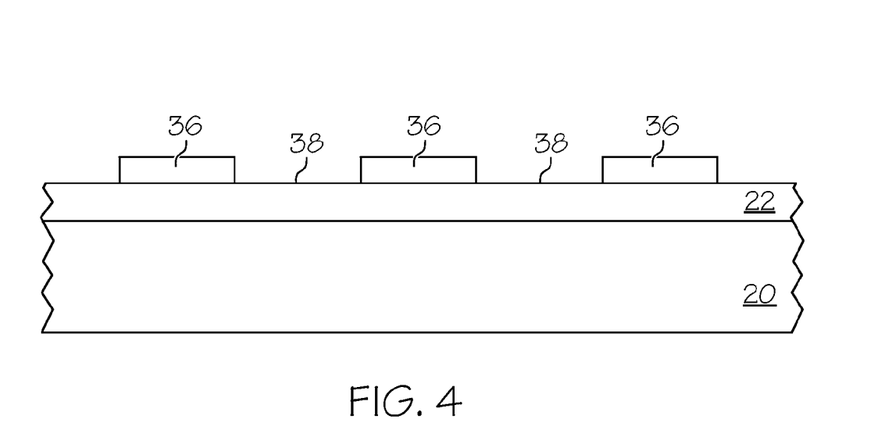

The process continues, as illustrated in FIG. 4 by developing the now selectively exposed layer of photosensitive material to form a patterned mask layer 36. If the layer of photosensitive material is of a positive nature, the developing step removes exposed portion 30 of the layer of photosensitive material, as illustrated, to selectively uncover a portion 38 of the polycrystalline silicon or other process material. Although not illustrated, if the layer of photosensitive material had instead been of a negative type, the developing step would have removed unexposed portion 32. The layer of photosensitive material can be developed, as is well known, by spraying or otherwise contacting the selectively exposed layer to a liquid chemical developer.

Figure 5:
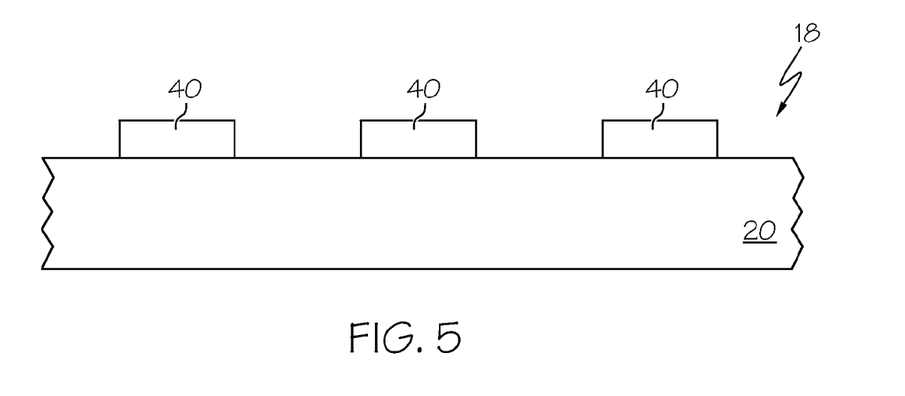

Patterned mask layer 36 can be used as a mask to process the underlying polycrystalline silicon or other material layer. For example, the patterned mask layer can be used as an etch mask to etch uncovered portions 38, as illustrated in FIG. 5, to form gate electrodes 40 or the like. Patterned mask layer 36 can also be used, for example, as an ion implantation mask, as a silicidation mask, or to facilitate other process steps.

Figure 6:
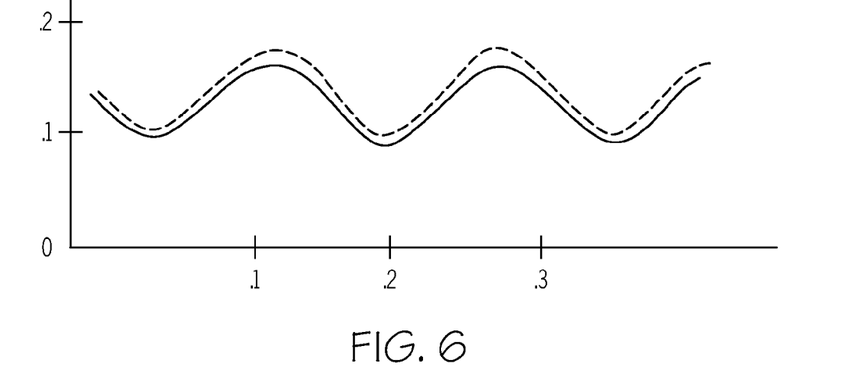
FIGS. 6-8 illustrate, in graphical form, aerial image plots showing improvement in image resolution resulting from practice of the invention.
Figure 7:
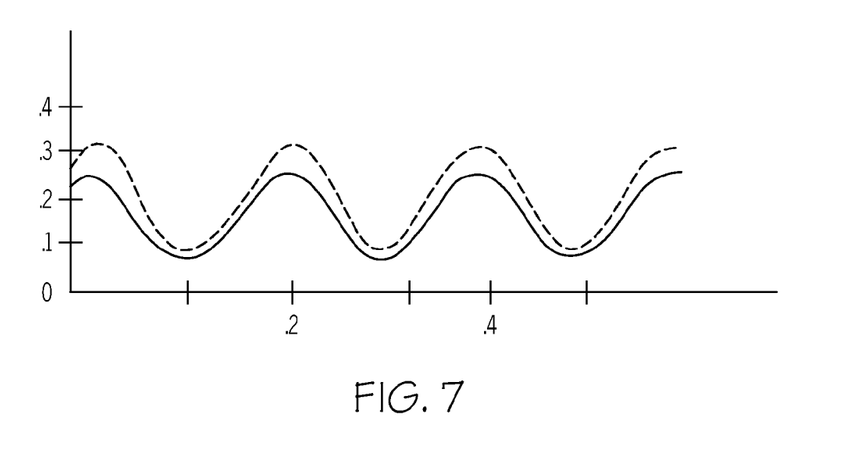
Figure 8:
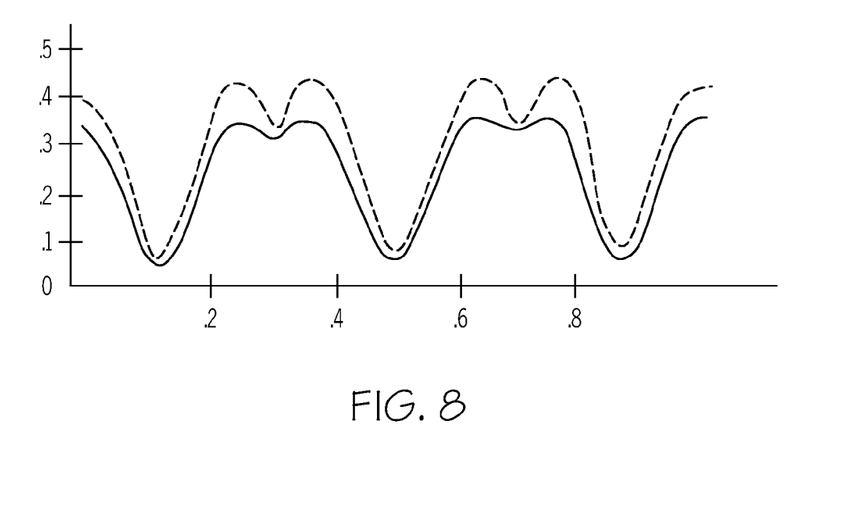

FIGS. 6-8 provide aerial image plots that illustrate the improvement in image resolution that results from use of the optically transparent phase shift assist features. In each of the figures solid line 56 indicates results from using conventional attPSM lithography and dotted line 58 indicates results from practice of the present invention. In each of the figures vertical axis 60 represents intensity as measured at the surface of photosensitive material 24 and horizontal axis 62 represents distance, measured in micrometers (μm) along the surface of the photosensitive material. FIG. 6 illustrates the aerial image plot for an attPSM pattern 254 having a stripe width of 60 nm and a pitch (i.e., a pattern repeat distance) of 150 nm. FIG. 7 illustrates the aerial image plot for an attPSM pattern 254 having a stripe width of 60 nm and a pitch of 190 nm. FIG. 7 illustrates the aerial image plot for an attPSM pattern 254 having a stripe width of 60 nm and a pitch of 380 nm. In each example the vertical portions of the plots are more steep and the ratio of maximum intensity to minimum intensity (i.e., radiation intensity in exposed areas versus unexposed areas) is greater when using the present invention than when using the prior art. Accordingly, image resolution is improved by practice of the present invention. Further, although not illustrated in the figures, the use of a phase shift mask incorporating optically transparent phase shift portions as has been described and illustrated moves the aerial image closer to the isofocal operating point and improves the depth of focus of the process. This, in turn, improves the through-focus process window.

Figure 12:
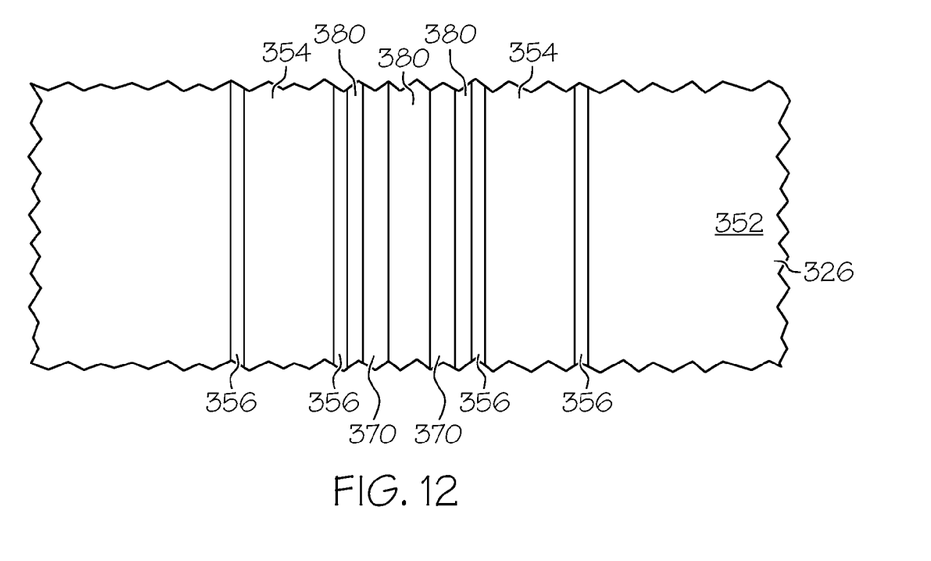
FIGS. 12 and 13 illustrate, in plan view and cross section, respectively, a phase shift mask in accordance with a further embodiment of the invention.
Figure 13:
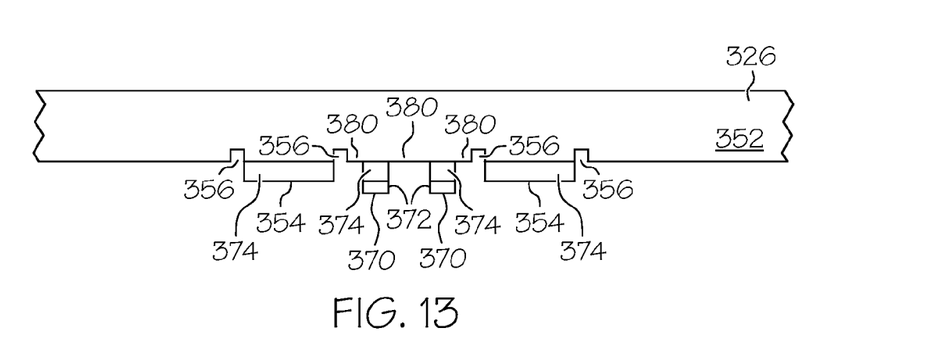

FIGS. 12 and 13 illustrate, in plan view and cross section, respectively, a portion of a phase shift mask 326 in accordance with a further embodiment of the invention. PSM 326 includes an optically transparent substrate 352 that can be formed, for example, of quartz or other optically transparent material, a plurality of attPSM patterns 354 formed of a layer of partially transparent material having a thickness selected to produce a phase shift of about 180° in the transmitted radiation, optically transparent phase shift elements 356 such as recesses etched into the surface of optically transparent substrate 352, and a plurality of binary sub-resolution assist features (SRAF) 370 positioned between adjacent ones of the attPSM patterns. Optically transparent, non-phase shifted portions 380 remain, for example, between SRAF patterns and in the space between the attPSM patterns and the SRAF. The binary SRAF, are described more fully in commonly assigned, co-pending U.S. patent application Ser. No. 11/430,074 filed May 8, 2006, the contents of which are incorporated herein by reference in their entirety. The binary SRAF are formed of a material that is opaque to the incident radiation. The binary SRAF can be formed, for example, from a layer of chrome or a layer of chrome 372 overlying the partially transparent film 374 used to form the attPSM patterns. Mask 326 can be formed for example from an optically transparent quartz substrate that is overlaid by a layer of MoSi that, in turn, is overlaid with a layer of chrome. Both binary SRAF portion 370 and attPSM patterns 354 are patterned and etched with the etch extending through both layers to the surface of the quartz substrate. The layer of chrome is then removed from the attPSM patterns. Optically transparent phase shift regions 356 are etched into the surface of quartz substrate 352 to a sufficient depth to cause a phase shift of about 180° in the incident radiation as it passes through the substrate. The use of binary SRAF 370 further improves the depth of focus that can be realized with the process and thus further improves the process window.

In accordance with an embodiment of the invention semiconductor devices are fabricated in the same manner as illustrated in FIGS. 1-5 except phase shift mask 326 is used in the method instead of phase shift mask 26.

Figure 14:
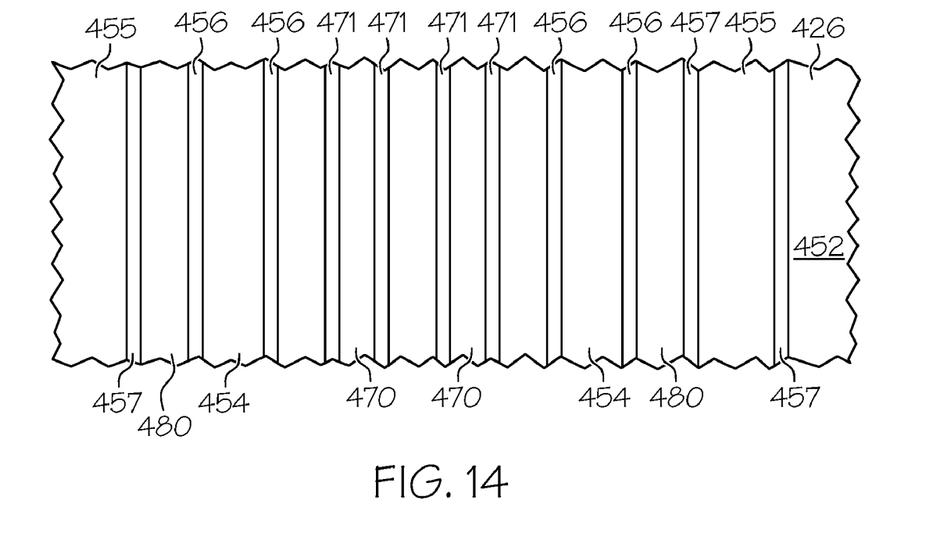
FIGS. 14 and 15 illustrate, in plan view and cross section, respectively, a phase shift mask in accordance with yet further embodiments of the invention.
Figure 15:
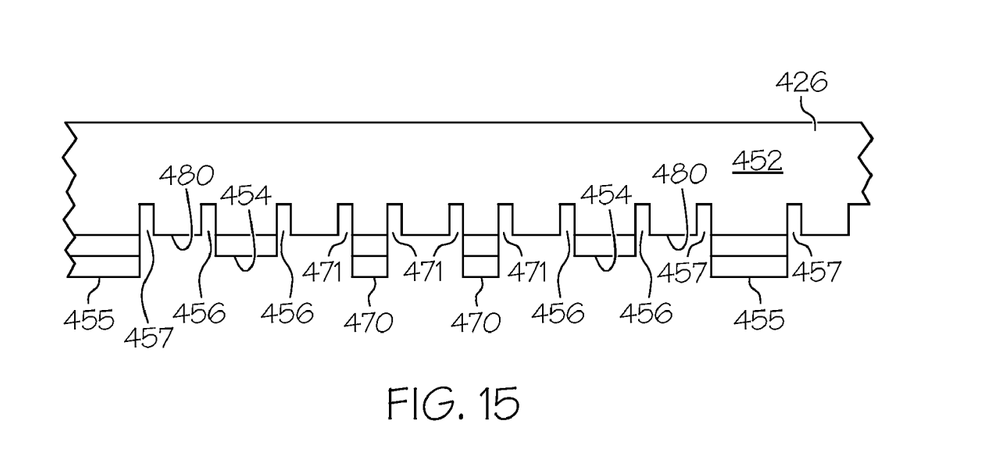

FIGS. 14 and 15 illustrate, in plan view and cross section, respectively, a portion of a phase shift mask 426 in accordance with yet another embodiment of the invention. Phase shift mask patterns are generally used to pattern fine geometry elements of the circuit being implemented. Large geometry elements can be patterned with more conventional binary mask patterns. Phase shift mask 426 includes both attPSM patterns 454 and binary mask patterns 455 formed on an optically transparent substrate 452 formed of quartz or other optically transparent material. The attPSM patterns can be formed, for example, from a layer of partially transparent material such as a layer of MoSi having a thickness selected to produce a phase shift of about 180° in the transmitted radiation. The binary mask patterns can be formed, for example, from a layer of chrome or other optically opaque material. In accordance with an embodiment of the invention, optically transparent phase shift elements 456 such as recesses etched into the surface of optically transparent substrate 452 are formed adjacent the edge of attPSM patterns 454 and optically transparent phase shift elements 457 are formed adjacent the edge of binary mask patterns 455. In addition, in accordance with a further embodiment of the invention, a plurality of sub-resolution assist features (SRAF) 470 may be positioned between adjacent ones of the attPSM patterns. Still further, optically transparent phase shift elements 471 may also be formed adjacent the SRAF. Transparent, non-phase shifted portions 480 of the mask remain, for example, between attPSM patterns 454 and binary patterns 455. Phase shift mask 426 can be formed from a quartz substrate upon which a layer of MoSi or other phase shifting semitransparent material is deposited. A layer of chrome or other opaque material is deposited over the MoSi. Both the MoSi and the chrome are patterned and etched with the etch extending through both layers to form attPSM patterns 454, binary patterns 455, and SRAF 470. The layer of chrome is then etched from the attPSM patterns, but is retained on the binary patterns and the SRAF. Optically transparent phase shift regions 456, 457, and 471 are etched into the surface of quartz substrate 452 to a sufficient depth to cause a phase shift of about 180° in the incident radiation as it passes through the substrate. As explained above, semiconductor devices are fabricated in the same manner as illustrated in FIGS. 1-5 except phase shift mask 426 is used in the method instead of phase shift mask 26.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. A method for fabricating a semiconductor device comprising the steps of:
   providing a semiconductor substrate;
   depositing a material layer overlying the semiconductor substrate;

applying a layer of photosensitive material overlying the material layer;

positioning a lithographic mask over the layer of photosensitive material, the mask comprising an optically transparent portion, an attPSM pattern that produces a phase shift of about 180°, and a phase shifted optically transparent portion having a first edge and a second edge, the first edge abutting the attPSM pattern and the second edge abutting the optically transparent portion;

exposing the layer of photosensitive material to radiation passing through the mask to form selectively exposed portions of the layer of photosensitive material;

developing the layer of photosensitive material to form a patterned layer overlying the material layer; and processing the material layer using the patterned layer as a process mask.

2. The method of claim 1 wherein the step of positioning a lithographic mask comprises the step of positioning a lithographic mask comprising a layer of quartz, a layer of patterned absorbing phase shift material on the quartz, and a recess etched into the quartz in alignment with the layer of patterned absorbing phase shift material.

3. The method of claim 1 wherein the step of exposing comprises the step of passing radiation through a mask comprising patterned MoSi overlying a quartz substrate and further comprising optically transparent quartz portions adjacent the patterned MoSi etched to effect a 180° phase shift in the radiation.

4. The method of claim 1 wherein the step of positioning a lithographic mask comprises the step of positioning a lithographic mask further including a binary sub resolution assist feature spaced apart from the attPSM pattern.

5. The method of claim 4 wherein the step of positioning a lithographic mask comprises the step of positioning a lithographic mask further including a binary pattern.

6. The method of claim 5 wherein the step of positioning a lithographic mask comprises the step of positioning a lithographic mask further including phase shifted optically transparent portions adjacent the binary sub resolution assist feature and the binary pattern.

7. The method of claim 1 wherein the step of depositing a material layer comprises the step of depositing a layer of polycrystalline silicon and wherein the step of processing the material layer comprises the step of etching the polycrystalline silicon layer to form a gate electrode.

8. A method for fabricating a semiconductor device comprising the steps of:

forming a layer of material overlying a semiconductor substrate;

applying a layer of photosensitive material overlying the layer of material;

directing radiation through a mask to selectively expose a first portion of the layer of photosensitive material and to leave unexposed a second portion of the layer of photosensitive material, the mask comprising an attPSM pattern bounded by a phase shifted optically transparent portion to define the second portion, the attPSM pattern producing a phase shift of about 180°, the phase shifted optically transparent portion having a first edge adjacent to the attPSM pattern and a second edge adjacent a non-phase shifted optically transparent portion; and developing the layer of photosensitive material to form a process mask overlying the layer of material.

9. The method of claim 8 wherein the step of directing radiation comprises the step of directing radiation through a mask comprising an attPSM pattern having a first edge and a second edge, a first phase shifted optically transparent portion adjacent the first edge and a second phase shifted optically transparent portion adjacent the second edge.

10. The method of claim 8 wherein the step of directing radiation comprises the step of directing radiation through a mask further comprising a binary sub resolution assist feature spaced apart from the attPSM pattern.

11. The method of claim 10 wherein the step of directing radiation comprises the step of directing radiation through a mask further comprising a binary pattern.

12. The method of claim 11 wherein the step of directing radiation comprises the step of directing radiation through a mask further comprising a phase shifted optically transparent portion adjacent the binary sub resolution assist feature.

13. The method of claim 8 wherein the step of forming a layer of material comprises the step of depositing a layer of gate electrode forming material.

14. A lithographic mask comprising:

an optically transparent substrate having a non-phase shifted optically transparent portion;

an attPSM pattern overlying the optically transparent substrate that produces a phase shift of about 180°; and a phase shifted optically transparent portion etched into the surface of the optically transparent substrate and having a first edge and a second edge, the first edge abutting and aligned with an edge of the attPSM pattern and the second edge abutting and aligned with the non-phase shifted optically transparent portion of the optically transparent substrate.

15. The lithographic mask of claim 14 wherein the optically transparent substrate comprises quartz and the phase shifted optically transparent portion comprises a recess in the optically transparent substrate.

16. The lithographic mask of claim 14 further comprising a binary sub resolution assist feature.

17. The lithographic mask of claim 16 further comprising a phase shifted optically transparent portion adjacent the binary sub resolution assist feature.

18. The lithographic mask of claim 16 further comprising a binary pattern.

19. The lithographic mask of claim 18 further comprising a phase shifted optically transparent portion adjacent the binary pattern.

20. The lithographic mask of claim 16 wherein the optically transparent substrate comprises a quartz substrate, the attPSM pattern comprises MoSi, the phase shifted optically transparent portion comprises a recess in the quartz substrate, and the binary sub resolution assist feature comprises chrome.

* * * * *